United States Patent
Takamura et al.

(10) Patent No.: US 9,053,942 B2
(45) Date of Patent: Jun. 9, 2015

(54) POLYCRYSTALLINE SILICON WAFER

(71) Applicant: JX Nippon Mining & Metals Corporation, Tokyo (JP)

(72) Inventors: Hiroshi Takamura, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/381,431

(22) PCT Filed: Feb. 20, 2013

(86) PCT No.: PCT/JP2013/054081
§ 371 (c)(1),
(2) Date: Aug. 27, 2014

(87) PCT Pub. No.: WO2013/136922
PCT Pub. Date: Sep. 19, 2013

(65) Prior Publication Data
US 2015/0108490 A1     Apr. 23, 2015

(30) Foreign Application Priority Data

Mar. 12, 2012  (JP) ................................ 2012-054826

(51) Int. Cl.
*H01L 29/04*     (2006.01)
*H01L 29/16*     (2006.01)
*H01L 29/06*     (2006.01)

(52) U.S. Cl.
CPC ............... *H01L 29/04* (2013.01); *H01L 29/16* (2013.01); *H01L 29/0684* (2013.01)

(58) Field of Classification Search
CPC .. C30B 29/06; C01B 33/02; H01L 21/02381; H01L 21/02433; H01L 21/02532; H01L 21/02595; H01L 21/02002; H01L 29/04
See application file for complete search history.

(56) References Cited

U.S. PATENT DOCUMENTS

| | | |
|---|---|---|
| 8,236,428 B2 | 8/2012 | Satoh et al. |
| 8,252,422 B2 | 8/2012 | Takamura et al. |
| 8,512,868 B2 | 8/2013 | Suzuki et al. |
| 8,647,747 B2 | 2/2014 | Takamura et al. |

(Continued)

FOREIGN PATENT DOCUMENTS

| | | |
|---|---|---|
| JP | 2001-308352 A | 11/2001 |
| JP | 2004-289065 A | 10/2004 |

(Continued)

*Primary Examiner* — Whitney T Moore
(74) *Attorney, Agent, or Firm* — Howson & Howson LLP

(57) ABSTRACT

A polycrystalline silicon wafer produced based on a melting method and having an outer diameter of 450 mm or more, wherein a depth of scratches on the polycrystalline silicon wafer is 10 μm or less. A polycrystalline silicon wafer produced based on a melting method and having an outer diameter of 450 mm or more, wherein a maximum number of scratches having a width of 40 μm or more and 100 μm or less and a depth of more than 10 μm and 40 μm or less formed on the polycrystalline silicon wafer is one or less per section when the overall polycrystalline silicon wafer is divided into 100 mm-square sections, and a depth of remaining scratches is 10 μm or less. Provided is a large polycrystalline silicon wafer, particularly a silicon wafer having a wafer size in which the outer diameter is 450 mm or more, in which a small number of scratches are generated on the wafer surface and which has mechanical properties similar to those of a monocrystalline silicon wafer.

8 Claims, 4 Drawing Sheets

Tolerable Scratch

(56) References Cited

U.S. PATENT DOCUMENTS

| | | |
|---|---|---|
| 8,659,022 B2 | 2/2014 | Suzuki et al. |
| 2010/0016144 A1 | 1/2010 | Suzuki et al. |
| 2010/0187661 A1 | 7/2010 | Suzuki et al. |
| 2010/0330325 A1 | 12/2010 | Suzuki et al. |
| 2013/0341622 A1 | 12/2013 | Takamura et al. |

FOREIGN PATENT DOCUMENTS

| | | |
|---|---|---|
| JP | 2009-038220 A | 2/2009 |
| JP | 2012-017222 A | 1/2012 |
| WO | 2009-119338 A1 | 10/2009 |

Tolerable Scratch

※Wafer Size : 50mmx200mmx925μmt
(different from size indicated in specification)

4 - point Bending Fixture

Silicon Wafer Sample

Depth of Scratch: 14μm

Depth of Scratch: 27μm

Depth of Scratch: 54μm

POLYCRYSTALLINE SILICON WAFER

BACKGROUND

The present invention relates to a polycrystalline silicon wafer, and in particular relates to a silicon wafer having an outer diameter of 450 mm or more for use in mechanical testing.

The shape of a monocrystalline silicon wafer that is used in an LSI process is becoming a larger diameter with the times. This is because, if the wafer diameter can be enlarged, more semiconductor devices can be produced from a single wafer, and the unit price of chips can thereby be reduced.

Meanwhile, pursuant to the further miniaturization of devices, the quality requirements of silicon wafers are becoming even stricter. Thus, when the wafer size shifts to large products, it is necessary to resolve the issues of quality in addition to the issues of scaling, and there is a problem in that the market price of next-generation size monocrystalline wafers will be extremely expensive.

According to ITRS (International Technology Roadmap for Semiconductors), it is anticipated that the timing that the wafer size will shift from a diameter of 300 mm to a diameter of 450 will be around 2012, and the timing that the wafer size will shift from a diameter of 450 mm to a diameter of 675 mm will be around 2019, and it is considered that the pursuit of larger diameter and higher quality of wafers will continue into the future.

When the wafer size is changed, the case (FOSB) for transporting the wafers and the wafer case (FOUP) for moving the wafers between the respective processes will also change as a matter of course. Moreover, the shape of robots that transfer wafers and machines for manufacturing the devices also need to be newly designed and developed to match the next-generation size wafers.

Accordingly, when the wafer size shifts to large products, next-generation wafers will be used for performing various types of tests and verifications for various types of purposes. Among these tests and verifications, there are usages that do not necessarily require the use of an expensive monocrystalline silicon wafer.

For example, upon developing robots for transporting wafer cases or wafers, the intended testing can be performed without having to use a monocrystalline wafer so as long as the mechanical properties of the used wafer; for instance, the weight and strength of the wafer and gravitational sag of the wafer, are equivalent to those of a monocrystalline wafer.

Since this kind of wafer (hereinafter referred to as the "mechanical wafer") is not a monocrystalline wafer that can actually be used for producing a device, it is extremely important that the mechanical wafer is of low cost. Accordingly, with a mechanical wafer, cost reduction must be sought while omitting unwanted quality, and it is necessary to understand the conditions so that the mechanical properties thereof will be the same level as those of a monocrystalline wafer.

By way of reference, to list past publications, as an LSI sintered silicon wafer, Patent Document 1 proposes a sintered compact having a crystal grain size of 100 μm or less, and Patent Document 2 proposes a sintered compact having an average grain size of 1 to 10 μm.

While these sintered silicon dummy wafers can increase the strength of the wafer by adjusting the transverse rupture strength, tensile strength, and Vicker's hardness, there is naturally a limit in causing the gravitational sag of these wafers to approach that of a monocrystalline silicon wafer, and this is the reason why the use of such sintered silicon dummy wafers as a mechanical wafer having a diameter of 450 mm or more is extremely limited.

Moreover, Patent Document 3 describes polycrystalline silicon having an outer diameter of 48 mm or more and 450 mm or less, and a method of reducing the roughness Ra and surface sagging. Nevertheless, the cause of cracks in polycrystalline silicon of 450 mm or more is not the roughness or sagging of the surface, but is rather caused by fine scratches. Thus, it cannot be said that Patent Document 3 has resolved the problems encountered in polycrystalline silicon of 450 mm or more.

When using polycrystalline silicon as a mechanical wafer, substantially the same behavior as monocrystalline silicon is expected, and it is extremely important that the polycrystalline silicon wafer does not deviate from both the bending strength and gravitational sag of a monocrystalline silicon wafer. With respect to this point, while it has been confirmed that the mechanical strength demanded in a mechanical wafer is considerably affected by the scratches on the polycrystalline silicon surface, no conventional technology has discovered a solution for resolving this problem.

PRIOR ART DOCUMENTS

Patent Documents

Patent Document 1: Japanese Patent Application Publication No. 2004-289065
Patent Document 2: International Publication No. WO2009/011233
Patent Document 3: Japanese Patent Application Publication No. 2009-38220

SUMMARY OF THE INVENTION

The present invention was devised in view of the foregoing problems, and an object of this invention is to provide a large polycrystalline silicon wafer, particularly a silicon wafer having a wafer size in which the outer diameter is 450 mm or more, in which a small number of scratches are generated on the wafer surface and which has mechanical properties similar to those of a monocrystalline silicon wafer.

In order to achieve the foregoing object, the present inventors and others discovered that, as a result of verification through repeated production tests of polycrystalline silicon, it is possible to obtain a large polycrystalline silicon wafer having mechanical properties similar to those of a monocrystalline silicon wafer.

Based on the foregoing discovery, the present invention provides the following invention:

1) A polycrystalline silicon wafer produced based on a melting method and having an outer diameter of 450 mm or more, wherein a depth of scratches on the polycrystalline silicon wafer is 10 μm or less.

2) A polycrystalline silicon wafer produced based on a melting method and having an outer diameter of 450 mm or more, wherein a maximum number of scratches having a width of 40 μm or more and 100 μm or less and a depth of more than 10 μm and 40 μm or less formed on the polycrystalline silicon wafer is one or less per section when the overall polycrystalline silicon wafer is divided into 100 mm-square sections, and a depth of remaining scratches is 10 μm or less.

3) A polycrystalline silicon wafer produced based on a melting method and having an outer diameter of 450 mm or more, wherein a maximum number of scratches having a width of 20 μm or more and 40 μm or less and a depth of more than 20 µm and 40 µm or less formed on the polycrystalline silicon wafer is one or less per section when the overall polycrystalline silicon wafer is divided into 100 mm-square sections, and a depth of remaining scratches is 10 µm or less.

4) A polycrystalline silicon wafer produced based on a melting method and having an outer diameter of 450 mm or more, wherein a maximum number of scratches having a width of 20 µm or more and 40 µm or less and a depth of more than 10 µm and 20 µm or less formed on the polycrystalline silicon wafer is three or less per section when the overall polycrystalline silicon wafer is divided into 100 mm-square sections, and a depth of remaining scratches is 10 µm or less.

5) The polycrystalline silicon wafer according to any one of 1) to 4), wherein scratches having a depth of less than 2 µm exist as scratches in which CMP is not performed.

The present invention yields a superior effect of being able to provide a large polycrystalline silicon wafer, particularly a silicon wafer having a wafer size in which the outer diameter is 450 mm or more, in which a small number of scratches (scratches that have a strong impact) are generated on the wafer surface, and which has mechanical properties similar to those of a monocrystalline silicon wafer.

DETAILED DESCRIPTION

The polycrystalline silicon wafer of the present invention is a polycrystalline silicon wafer that is produced based on the melting method. As explained in the following Examples, when polycrystalline silicon that is subject to appropriate annealing treatment is used, it is possible to obtain a mechanical strength that is equivalent to a monocrystalline silicon wafer without having to perform CMP (Chemical Mechanical Polishing) that is normally performed in the production of a monocrystalline silicon wafer.

Since these polycrystalline silicon wafers are not subject to CMP, the polycrystalline silicon wafer surface will usually have shallow scratches. Moreover, it has also become known that the saw marks that are generated during the slicing process and the scratches that are generated during the lapping process cannot be sufficiently eliminated only with primary polishing, and in some cases these marks and scratches affect the strength of the polycrystalline silicon wafer.

Thus, the present inventors discovered the correlation between the size of scratches on a polycrystalline silicon wafer surface and the mechanical properties of a polycrystalline silicon wafer by examining and researching the relation of the two, and consequently discovered the conditions for causing the mechanical properties of a polycrystalline silicon wafer to be similar to the mechanical properties of a monocrystalline wafer by controlling (adjusting) the size of scratches of a polycrystalline silicon wafer surface.

The polycrystalline silicon wafer of the present invention is a polycrystalline silicon wafer produced based on the melting method and having an outer diameter of 450 mm or more, wherein the depth of scratches on the polycrystalline silicon wafer is 10 µm or less. Since scratches having this level of depth do not deteriorate the mechanical properties of a silicon wafer even when the width of scratches is large, the width of scratches is not indicated, and the same applies hereafter. It is thereby possible to improve the mechanical properties of a silicon wafer, and obtain a polycrystalline silicon wafer having mechanical properties similar to those of a monocrystalline wafer.

In the present invention, while the depth of scratches is 10 µm or less as described above, this does not mean that the depth of scratches is 0 µm or that the number of scratches having a depth of 10 µm or less is 0 scratches. Since the object here is to obtain mechanical strength that is equivalent to that of a monocrystalline silicon wafer without performing costly CMP (Chemical Mechanical Polishing), scratches having a depth of less than 2 µm exist. In other words, scratches having a depth of less than 2 µm exist as scratches in which CMP is not performed.

Figure 1:
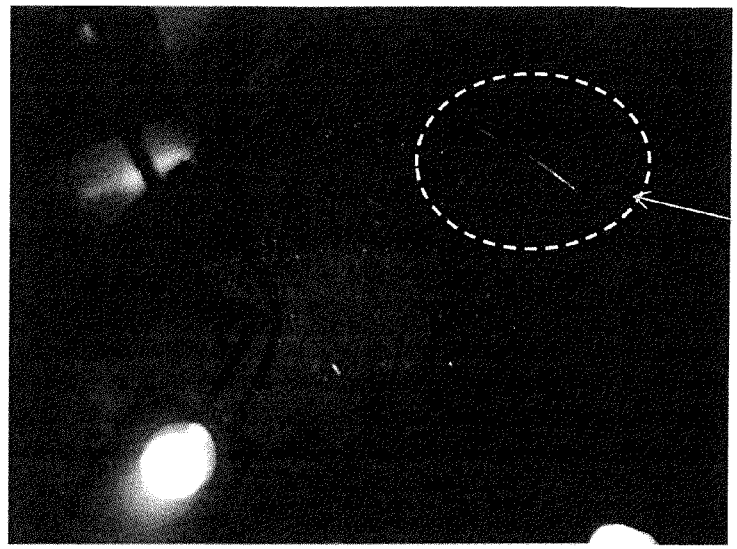
FIG. 1 is a diagram showing a state of observing scratches using a halogen lamp.

Nevertheless, scratches of the foregoing level can be ignored since they do not cause the deterioration in the mechanical properties of a polycrystalline silicon wafer. The state of observing these scratches with a high luminance halogen lamp is shown in FIG. 1. Moreover, there is no limitation to the shape of scratches, and the shape may be rectangular such as an oblong or square shape, circular (true circle or oval shape), or any other irregular shape. In all of the foregoing cases, the width of scratches is the longest width and the depth of scratches is the maximum depth based on a scratch (there are cases where this may be an aggregate of small defects) that is visible in a straight line on the surface of a polycrystalline silicon wafer.

Moreover, as conditions for obtaining a mechanical strength equivalent to that of a monocrystalline wafer, the present invention provides a polycrystalline silicon wafer produced based on the melting method and having an outer diameter of 450 mm or more, wherein a maximum number of scratches having a width of 40 µm or more and 100 µm or less and a depth of more than 10 µm and 40 µm or less formed on the polycrystalline silicon wafer is one or less per section when the overall polycrystalline silicon wafer is divided into 100 mm-square sections, and a depth of remaining scratches is 10 µm or less.

In this case also, since CMP is not performed, scratches having a depth of less than 2 µm exist. In other words, scratches having a depth of less than 2 µm exist as scratches in which CMP is not performed. Similar to the above, scratches of the foregoing level can be ignored since they do not cause the deterioration in the mechanical properties of a polycrystalline silicon wafer.

Moreover, as conditions for obtaining a mechanical strength equivalent to that of a monocrystalline wafer, the present invention provides a polycrystalline silicon wafer produced based on a melting method and having an outer diameter of 450 mm or more, wherein a maximum number of scratches having a width of 20 µm or more and 40 µm or less and a depth of more than 20 µm and 40 µm or less formed on the polycrystalline silicon wafer is one or less per section when the overall polycrystalline silicon wafer is divided into 100 mm-square sections, and a depth of remaining scratches is 10 μm or less. In this case also, since CMP is not performed, scratches having a depth of less than 2 μm exist. In other words, scratches having a depth of less than 2 μm exist as scratches in which CMP is not performed. Similar to the above, scratches of the foregoing level can be ignored since they do not cause the deterioration in the mechanical properties of a polycrystalline silicon wafer.

Moreover, as conditions for obtaining a mechanical strength equivalent to that of a monocrystalline wafer, the present invention provides a polycrystalline silicon wafer produced based on a melting method and having an outer diameter of 450 mm or more, wherein a maximum number of scratches having a width of 20 μm or more and 40 μm or less and a depth of more than 10 μm and 20 μm or less formed on the polycrystalline silicon wafer is three or less per section when the overall polycrystalline silicon wafer is divided into 100 mm-square sections, and a depth of remaining scratches is 10 μm or less.

In this case also, since CMP is not performed, scratches having a depth of less than 2 μm exist. In other words, scratches having a depth of less than 2 μm exist as scratches in which CMP is not performed. Similar to the above, scratches of the foregoing level can be ignored since they do not cause the deterioration in the mechanical properties of a polycrystalline silicon wafer.

Figure 6:
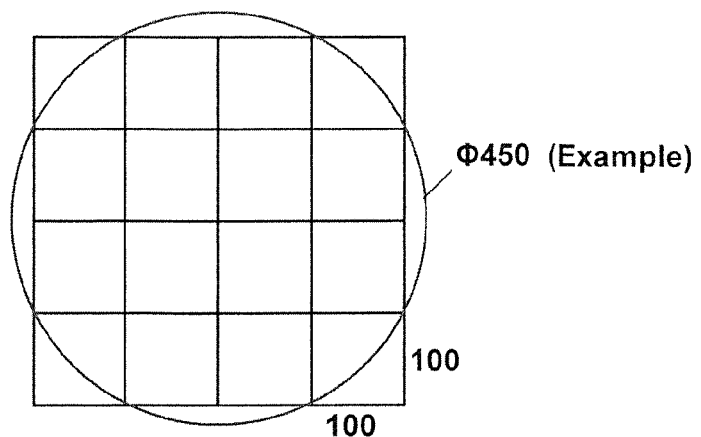
FIG. 6 is a diagram showing an example of dividing a 450 mm wafer into a lattice of 100 mm-square sections.

Based on the above, it is possible to obtain an inexpensive polycrystalline silicon wafer having mechanical properties similar to those of a monocrystalline wafer. An example of dividing a wafer having an outer diameter of 450 mm or more into a lattice of 100 mm-square sections is shown in FIG. 6. While there may be cases where the scratches are generated across two or more sections, the size of scratches in the respective sections when the wafer is divided into 100 mm-square sections means the longest width and maximum depth in the respective sections, and the same applies hereafter.

As described above, it is possible to obtain an inexpensive polycrystalline silicon wafer having mechanical properties similar to those of a monocrystalline wafer. The present invention is suitable for a polycrystalline silicon wafer of a silicon wafer size in which the outer diameter is 450 mm or more, and can be used as a mechanical wafer. Moreover, it is also possible to provide a polycrystalline silicon wafer in which the purity of the silicon is 3N to 7N, or even higher. The present invention also covers all of these aspects.

In addition to being used as a mechanical wafer, the polycrystalline silicon wafer explained above can also be used as a dummy filler wafer that is required for semiconductor manufacturing devices such as a vertical furnace when the cleanliness factor of the wafer surface is increased by using the purity of a high purity silicon material. Moreover, wafers having the foregoing level of surface scratches can also be applied to sputtering targets or various components of holders of semiconductor manufacturing devices or the like.

With the annealing treatment that is performed to cause the gravitational sag to be approximate to that of a monocrystal upon producing a polycrystalline silicon wafer, there are cases when this annealing treatment is performed to the block-shaped polycrystalline silicon ingot before being sliced, and cases when this annealing treatment is performed after the polycrystalline silicon ingot is sliced with a multi-wire saw. In either case, it is necessary to appropriately adjust the rate of temperature increase, holding temperature, holding time, rate of temperature decrease, degree of vacuum, and load.

While performing annealing treatment to the block-shaped polycrystalline silicon ingot is easier in terms of handling, in order to cause the gravitational sag to be approximate to that of a monocrystalline wafer, all wafers tend to stably have a more approximate gravitational sag when the annealing treatment is performed after the polycrystalline silicon ingot is sliced, which is closer to the wafer shape.

Annealing that is performed after the slicing may be performed after the multi-wire saw process, or after the lapping process or the polishing process. However, since the thickness of the wafer differs in each process, it is necessary to give consideration to this difference in thickness upon causing the gravitational sag to be approximate to that of a monocrystalline wafer. Moreover, in order to avoid the thermal diffusion of unwanted impurities, the wafer surface needs to be washed as needed before the annealing treatment.

It is thereby possible to obtain a large polycrystalline silicon wafer having an outer diameter of 450 mm or more and mechanical properties similar to those of a monocrystalline silicon wafer, and provide a large polycrystalline silicon wafer having mechanical properties similar to those of a monocrystalline silicon that can be used as a mechanical wafer. Moreover, since the CMP process can be omitted, it is possible to significantly improve the yield, and considerably lower the production cost.

EXAMPLES

The present invention is now explained with reference to the Examples. These Examples are merely for facilitating the understanding of this invention, and the present invention shall in no way be limited thereby. In other words, various modifications and other embodiments based on the technical spirit claimed in the claims shall be covered by the present invention as a matter of course. Note that Comparative Examples are also indicated for quality comparison.

Example 1

Silicon was melted in a silica crucible, and solidified from the bottom part of the crucible via unidirectional solidification to prepare a 690×690×250 mm silicon ingot having a purity of 6N. After the four corners of this ingot were cut off, the resulting ingot was subject to cylindrical grinding and processed to have an outer diameter of ϕ450 mm and a length of 200 mm.

Subsequently, this polycrystalline silicon ingot having a diameter of 451 mm was sliced with a multi-wire saw, subject to annealing treatment to achieve a gravitational sag that is approximate to that of a monocrystal, beveling and notch machining were performed thereto, and lapping treatment and primary polishing were subsequently performed to produce a double-sided mirror finish wafer having a diameter of 450 mm and a thickness of 925 μm.

Subsequently, a dicing saw was used to cut the obtained wafer into sizes of 100 mm×100 mm, and numerous samples were thereby prepared. The cutting was performed using a blade having fine teeth and at a low speed to prevent the cross section from becoming fractured and, by way of precaution, the cross section was etched with acid to eliminate any damage.

As a result of observing this 100 mm×100 mm×925 μmt sample with a microscope to confirm the number of scratches on the surface as well as the width and depth of the scratches, the surface scratches had a width of 100 μm or less and a depth of 10 μm or less.

Figure 2:
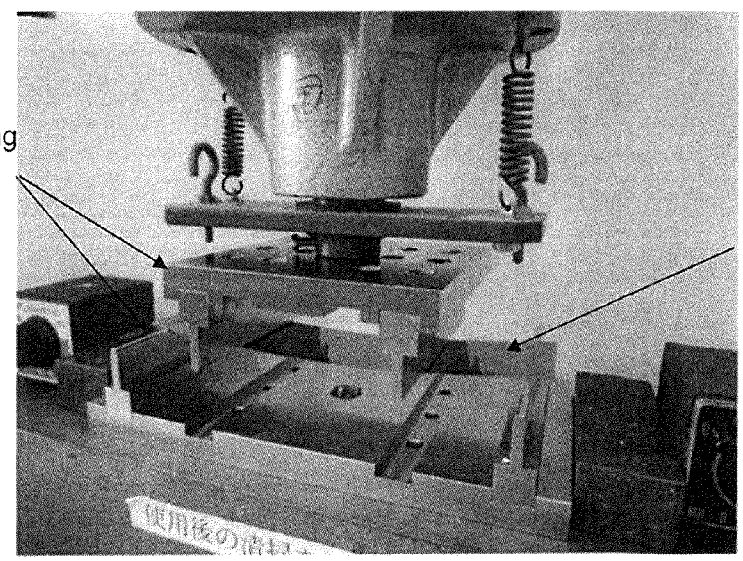
FIG. 2 is an external view (photograph) of the 4-point bending test of a silicon wafer.

In addition, a 4-point bending tester (FIG. 2) was used to measure the bending strength of the wafers cut into 100 mm-square sections. Consequently, with the surface scratches having a width of 100 μm or less and a depth 10 μm or less, the bending strength was 120 MPa without depending significantly on the width, length or quantity.

Example 2

Figure 3:
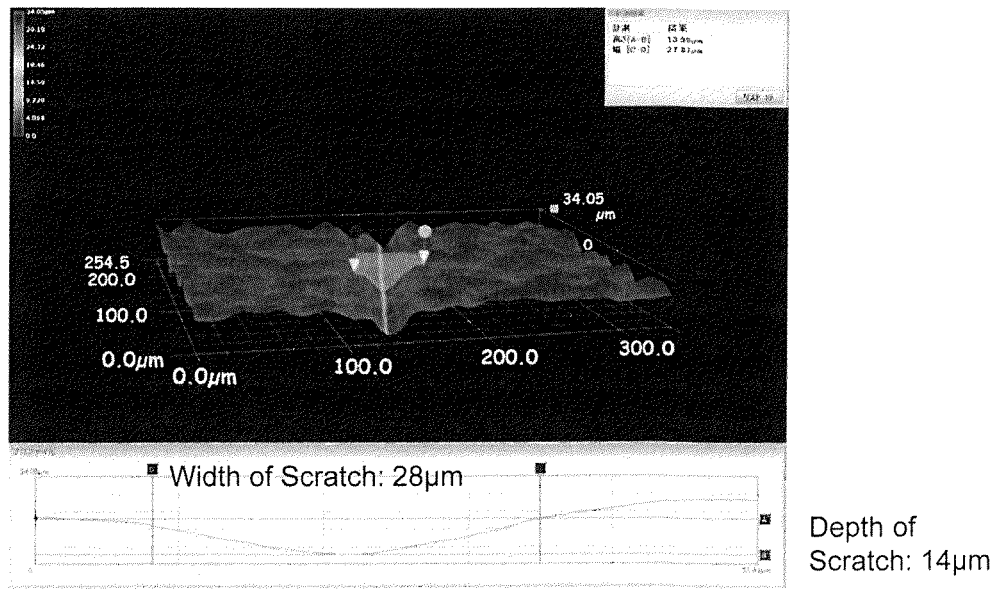
FIG. 3 is a diagram showing a state of examining the depth of the surface scratches in the 100 mm×100 mm×925 µmt sample of Example 2.

The depth of a surface scratch of the 100 mm×100 mm×925 μmt sample prepared in Example 1 was examined, and the results are shown in FIG. 3. In FIG. 3, the scratch had a width of 28 μm and a depth of 14 μm. When the scratches had a depth of 10 to 20 μm and a width of 20 to 40 μm, up to three scratches per 100 mm-square section, the bending strength was basically the same as the bending strength of a commercially available monocrystalline wafer that is free from scratches. By way of reference, the bending strength of samples within the foregoing range was ±10% or less from 100 MPa, which is the average bending strength of a monocrystalline wafer.

Example 3

Figure 4:
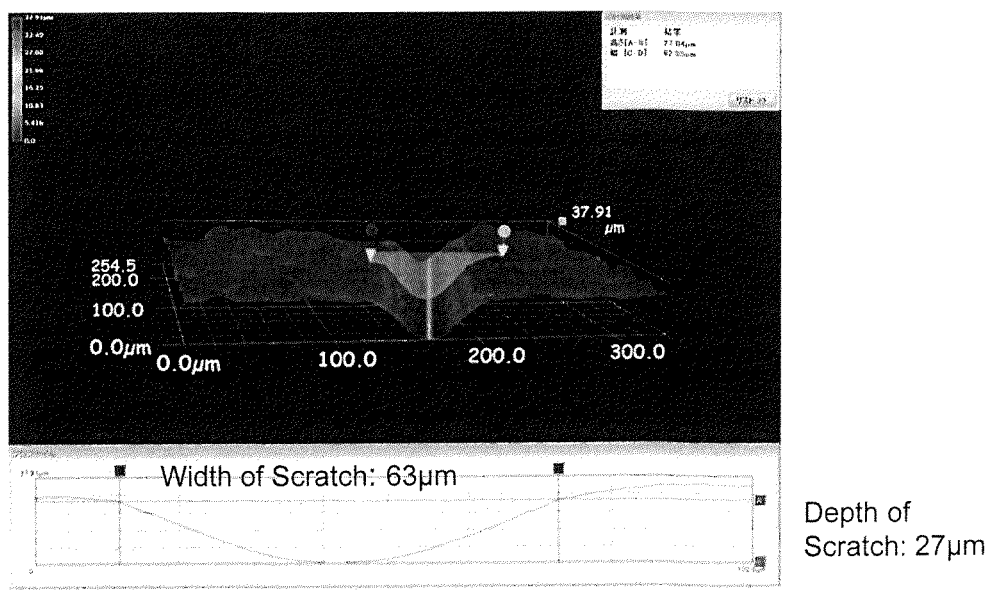
FIG. 4 is a diagram showing a state of examining the depth of the surface scratches in the 100 mm×100 mm×925 µmt sample of Example 3.

With the 100 mm×100 mm×925 μmt sample prepared in Example 1, when the scratches on the wafer surface had a width of 40 μm or more and 100 μm or less and a depth of 10 to 40 μm or less, or had a width of 20 μm or more and 40 μm or less and a depth of 20 μm or more and 40 μm or less, up to one scratch per 100 mm-square section, the bending strength was basically the same as the bending strength of a commercially available monocrystalline wafer that is free from scratches. An example of this scratch is shown in FIG. 4. In FIG. 4, the scratch had a width of 63 μm and a depth of 27 μm.

With the foregoing Examples, while the evaluation was based on a sample size of 100 mm×100 mm, actual wafers are used with a diameter of 450 mm or 675 mm. Nevertheless, if the strength of a wafer having a sample size of 100 mm×100 mm is considerably inferior to the strength of a commercially available monocrystalline wafer, this section will become a weak point in the overall wafer, and the strength will deteriorate as a matter of course. Accordingly, it can be said that the evaluation of a sample size of 100 mm×100 mm is correlated to the evaluation of the entire surface of the wafer.

Comparative Example 1

The 100 mm×100 mm×925 μmt sample prepared in Example 1 was used and the number of scratches was changed. When two or more scratches having a width of roughly 60 μm and a depth of roughly 30 μm were generated, the bending strength deteriorated considerably to 60 MPa or less.

Moreover, when four or more scratches having a width of roughly 30 μm and a depth of roughly 15 μm were generated, the bending strength deteriorated considerably to 60 MPa or less.

Comparative Example 2

Figure 5:
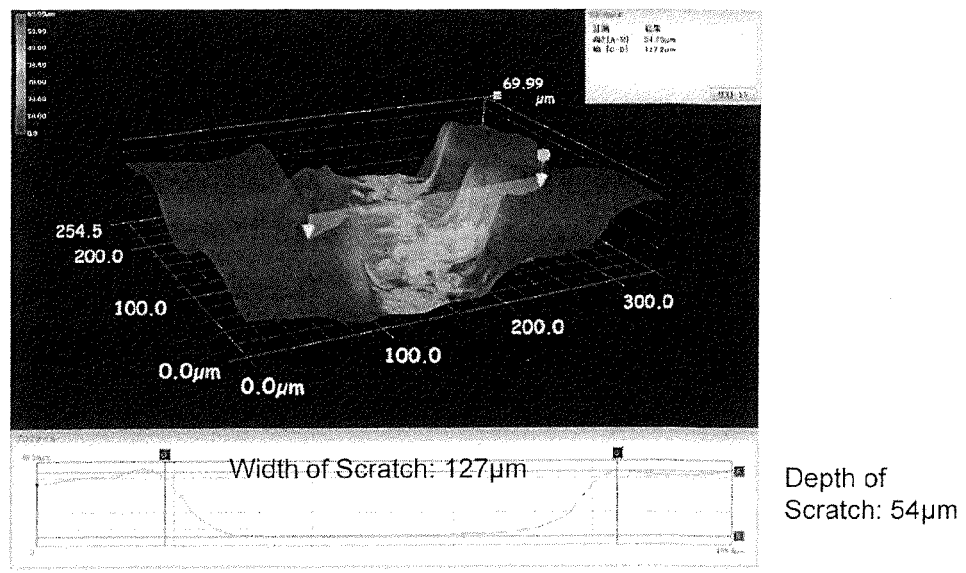
FIG. 5 is a diagram showing a state where the width of scratches is 127 µm and the depth of scratches is 54 µm in Comparative Example 2.

The 100 mm×100 mm×925 μmt sample prepared in Example 1 was used and the number of scratches was changed, and a state in which the scratch had a width of 127 μm and a depth of 54 μm is shown in FIG. 5. When the surface scratches had a depth of more than 40 μm or a width of 100 μm or more, the bending strength deteriorated considerably to 60 MPa or less.

It has been confirmed that, fundamentally speaking, the gravitational sag of wafers is more strongly affected by the annealing conditions rather than by the surface scratches. Accordingly, excluding cases where the scratches are extremely deep and wide as in the case described above, it is possible to achieve similar mechanical properties as a monocrystal, regardless of the type of surface scratches, so as long as the annealing conditions are adjusted to achieve similar gravitational sag as a monocrystal.

As described above, in a polycrystalline silicon wafer, the width of scratches, the depth of scratches, the number of scratches, and the dispersed form of scratches largely affect the mechanical properties. The present invention identified the modes of the foregoing scratches as a result of conducting numerous experiments, and thereby increases the mechanical strength of a polycrystalline silicon wafer and causes the mechanical properties of a polycrystalline silicon wafer to be approximate to the mechanical properties of a monocrystalline silicon wafer. However, since certain aspects may be difficult to understand, an outline of the examples of scratches in a conventional high cost monocrystal, Example 1 to Example 3 and Comparative Examples 1 and 2 is now explained with reference to the examples shown in FIG. 7.

Figure 7:
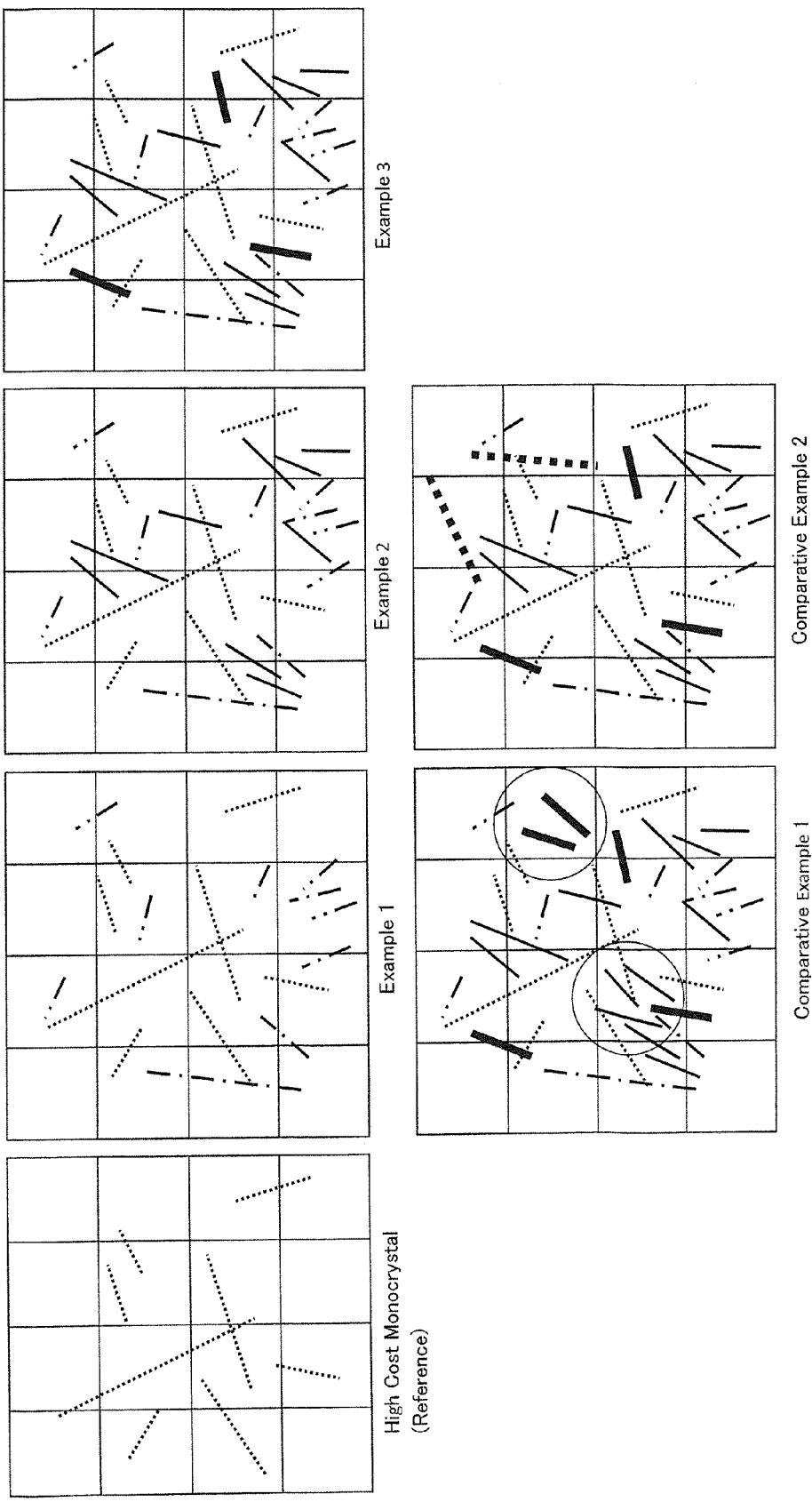
FIG. 7 is an explanatory diagram showing examples of scratches in a monocrystal, Example 1 to Example 3 and Comparative Examples 1 and 2 upon dividing the wafer into a lattice of 100 mm-square sections.

The leftmost diagram in the upper row of FIG. 7 shows the scratches of a monocrystalline silicon wafer with dotted lines. While the depth of the scratches is less than 2 μm, there are numerous scratches. In order to eliminate these scratches, high cost CMP treatment is required. Note that, while the scratches are shown as dotted lines, the dotted lines do not show the form (shape) of the scratches, and are merely shown as dotted lines to enable comparison with the other scratches described later. The following line types are used in the same meaning.

The second diagram from the left in the upper row of FIG. 7 is an explanatory diagram of Example 1 of the present application, and scratches of 10 μm or less (2 μm to 10 μm) of a polycrystalline silicon wafer are shown with dashed lines. As described above, scratches of this level do not cause deterioration in the mechanical properties of a polycrystalline silicon wafer. Needless to say, scratches of less than 2 μm shown with the dotted lines may also be ignored.

The third diagram from the left in the upper row of FIG. 7 is an explanatory diagram of Example 2 of the present application, and scratches having a depth of (more than) 10 μm to 20 μm or less are shown with thin lines. As described above, scratches of this level do not cause deterioration in the mechanical properties of a polycrystalline silicon wafer so as long as the maximum number of scratches is three or less per section when the overall polycrystalline silicon wafer is divided into 100 mm-square sections.

Needless to say, scratches of 10 μm or less shown with the dotted lines and dashed lines may be ignored. Note that the foregoing explanation only explained the depth of scratches since the depth of scratches has a significant effect. Nevertheless, as evident from the foregoing explanation, the width of scratches is also subject to limitation.

The rightmost diagram in the upper row of FIG. 7 is an explanatory diagram of Example 3 of the present application, and scratches having a depth of (more than) 20 μm to 40 μm or less are shown with thin lines. As described above, scratches of this level do not cause deterioration in the mechanical properties of a polycrystalline silicon wafer so as long as the maximum number of scratches is one or less per section when the overall polycrystalline silicon wafer is divided into 100 mm-square sections.

Needless to say, up to three scratches of thin lines may be ignored, and scratches of 10 μm or less shown with the dotted lines and dashed lines may be ignored. Note that the foregoing explanation only explained the depth of scratches since the depth of scratches has a significant effect. Nevertheless, as evident from the foregoing explanation, the width of scratches is also subject to limitation.

The left diagram in the lower row of FIG. 7 is an explanatory diagram of Comparative Example 1, and scratches having a depth of (more than) 20 μm to 40 μm or less are shown with thick lines. As described above, scratches of this level are inappropriate since they cause the deterioration in the mechanical properties of a polycrystalline silicon wafer when the maximum number of scratches is one or more (certain diagrams show a case of two scratches) per section when the overall wafer is divided into 100 mm-square sections. These scratches are inappropriate even when up to three scratches of thin lines may be ignored, and scratches of 10 μm or less shown with the dotted lines and dashed lines may be ignored. Note that the foregoing explanation only explained the depth of scratches since the depth of scratches has a significant effect. Nevertheless, as evident from the foregoing explanation, the width of scratches is also subject to limitation.

The right diagram in the lower row of FIG. 7 is an explanatory diagram of Comparative Example 2, and scratches having a depth of (more than) 40 μm are shown with thick chain lines. As described above, scratches of this level are inappropriate since they cause the deterioration in the mechanical properties of a polycrystalline silicon wafer when the maximum number of scratches is one or more per section when the overall wafer is divided into 100 mm-square sections. These scratches are inappropriate even when the other scratches may be ignored. Note that the foregoing explanation only explained the depth of scratches since the depth of scratches has a significant effect. Nevertheless, as evident from the foregoing explanation, the width of scratches is also subject to limitation.

The preset invention yields a superior effect of being able to provide a large polycrystalline silicon wafer, particularly a silicon wafer having a wafer size in which the outer diameter is 450 mm or more, in which a small number of scratches are generated on the wafer surface, and which has mechanical properties similar to those of a monocrystalline silicon wafer. Since the present invention can provide a wafer that enables testing at a considerably lower price in comparison to a monocrystalline wafer, particularly at the stage when the wafers will advance to their next-generation size, and the mechanical properties such as bending strength and gravitational sag of the provided wafer are similar to the properties of a monocrystalline wafer, the provided wafer is effective for the development of wafer cases and the development of transfer robots.

Accordingly, the polycrystalline silicon wafer of the present invention produced using a polycrystalline silicon ingot and having an outer diameter of 450 mm or more is effective as a large polycrystalline silicon wafer, and particularly effective as a mechanical silicon wafer, that is inexpensive and has a size of 450 mm or more.

The invention claimed is:

1. A polycrystalline silicon wafer produced based on a melting method and having an outer diameter of 450 mm or more, wherein a depth of scratches on the polycrystalline silicon wafer is 10 μm or less, and scratches having a depth of less than 2 μm exist as scratches.

2. The polycrystalline silicon wafer according to claim 1, wherein a maximum number of scratches having a width of 20 μm or more and 40 μm or less and a depth of more than 10 μm and 20 μm or less formed on the polycrystalline silicon wafer is three or less per section when the overall polycrystalline silicon wafer is divided into 100 mm-square sections, and a depth of remaining scratches is 10 μm or less.

3. The polycrystalline silicon wafer according to claim 2, wherein scratches having a depth of less than 2 μm exist as scratches in which CMP is not performed.

4. The polycrystalline silicon wafer according to claim 1, wherein scratches having a depth of less than 2 μm exist as scratches in which CMP is not performed.

5. A polycrystalline silicon wafer produced based on a melting method and having an outer diameter of 450 mm or more, wherein a maximum number of scratches having a width of 40 μm or more and 100 μm or less and a depth of more than 10 μm and 40 μm or less formed on the polycrystalline silicon wafer is one or less per section when the overall polycrystalline silicon wafer is divided into 100 mm-square sections, a depth of remaining scratches is 10 μm or less, and scratches having a depth of less than 2 μm exist as scratches.

6. The polycrystalline silicon wafer according to claim 5, wherein scratches having a depth of less than 2 μm exist as scratches in which CMP is not performed.

7. A polycrystalline silicon wafer produced based on a melting method and having an outer diameter of 450 mm or more, wherein a maximum number of scratches having a width of 20 μm or more and 40 μm or less and a depth of more than 20 μm and 40 μm or less formed on the polycrystalline silicon wafer is one or less per section when the overall polycrystalline silicon wafer is divided into 100 mm-square sections, and a depth of remaining scratches is 10 μm or less, and scratches having a depth of less than 2 μm exist as scratches.

8. The polycrystalline silicon wafer according to claim 7, wherein scratches having a depth of less than 2 μM exist as scratches in which CMP is not performed.

* * * * *